(12) United States Patent
Chen et al.

(10) Patent No.: US 8,748,277 B2
(45) Date of Patent: Jun. 10, 2014

(54) METHOD FOR FABRICATING A MOS TRANSISTOR WITH REDUCED CHANNEL LENGTH VARIATION

(75) Inventors: Xiangdong Chen, Irvine, CA (US); Wei Xia, Irvine, CA (US); Henry Kuo-Shun Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/613,520

(22) Filed: Sep. 13, 2012

(65) Prior Publication Data
US 2013/0017658 A1      Jan. 17, 2013

Related U.S. Application Data

(62) Division of application No. 12/589,357, filed on Oct. 21, 2009, now Pat. No. 8,269,275.

(51) Int. Cl.
  *H01L 21/336*      (2006.01)
(52) U.S. Cl.
  USPC ........... 438/286; 438/299; 438/301; 438/305; 438/306; 257/336; 257/343; 257/344; 257/E21.417

(58) Field of Classification Search
  USPC ................ 438/286, 299, 301, 302, 305, 306; 257/336, 343, 344, E21.417
  See application file for complete search history.

(56) References Cited

U.S. PATENT DOCUMENTS

| 6,172,401 B1 * | 1/2001 | Brand ........................... 257/344 |
| 6,677,210 B1 * | 1/2004 | Hebert ........................... 438/301 |
| 2003/0127694 A1 * | 7/2003 | Morton et al. ................. 257/371 |

* cited by examiner

*Primary Examiner* — Thinh T Nguyen
(74) *Attorney, Agent, or Firm* — Oblon, Spivak, McClelland, Maier & Neustadt, L.L.P.

(57) ABSTRACT

According to an exemplary embodiment, a method for fabricating a MOS transistor, such as an LDMOS transistor, includes forming a self-aligned lightly doped region in a first well underlying a first sidewall of a gate. The method further includes forming a self-aligned extension region under a second sidewall of the gate, where the self-aligned extension region extends into the first well from a second well. The method further includes forming a drain region spaced apart from the second sidewall of the gate. The method further includes forming a source region in the self-aligned lightly doped region and the first well. The self-aligned lightly doped region and the self-aligned extension region define a channel length of the MOS transistor, such as an LDMOS transistor.

20 Claims, 7 Drawing Sheets

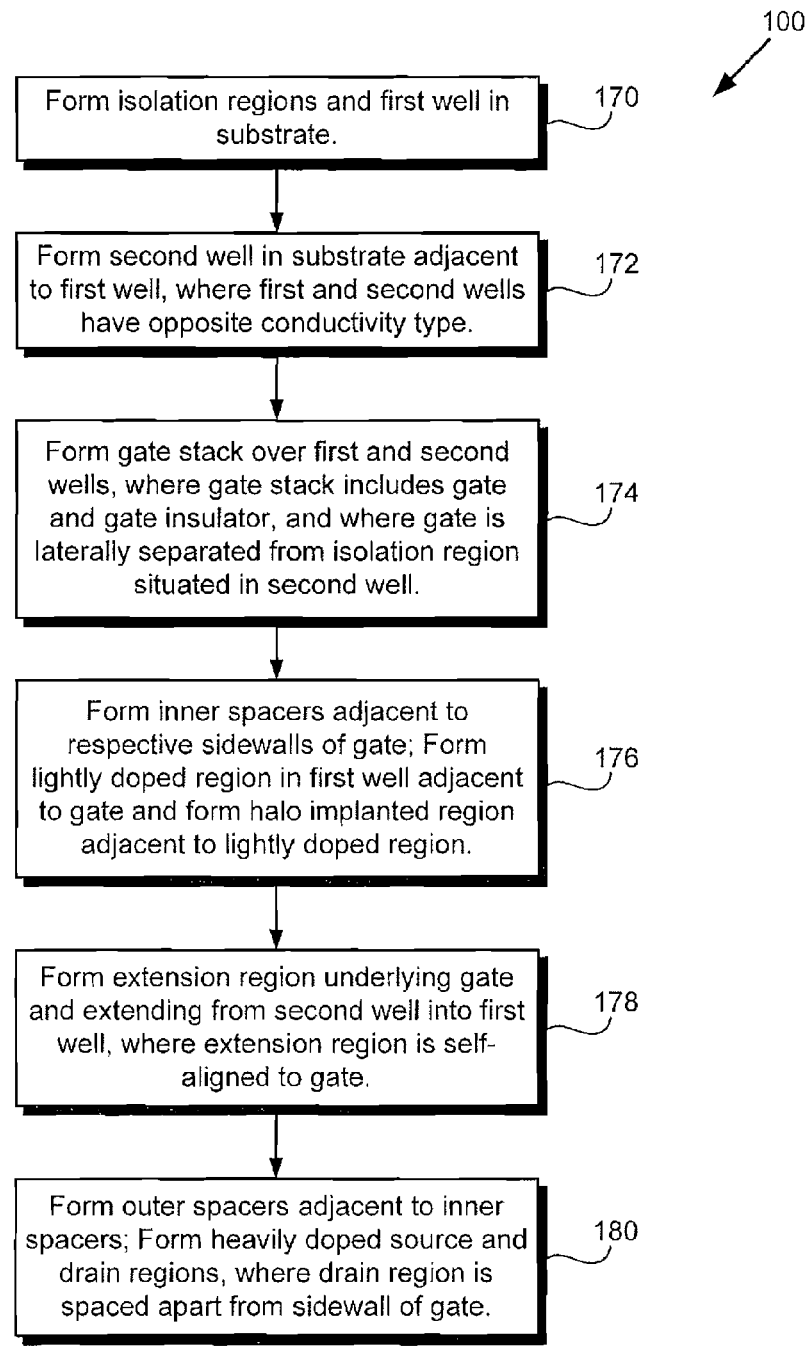

METHOD FOR FABRICATING A MOS TRANSISTOR WITH REDUCED CHANNEL LENGTH VARIATION

This is a divisional of application Ser. No. 12/589,357 filed Oct. 21, 2009.

BACKGROUND OF THE INVENTION

1. Field of the Invention

The present invention generally relates to the field of semiconductors. More particularly, the invention relates to transistor semiconductor structures.

2. Background Art

MOS (Metal Oxide Semiconductor) transistors, such as Lateral Diffusion Metal Oxide Semiconductor (LDMOS) transistors, can be utilized as power transistors in high voltage switches and power amplifiers in cell phones and other wireless communication devices, as well as other types of applications that require a high power transistor. In a MOS transistor, such as an LDMOS transistor, it is desirable to provide a high breakdown voltage and a low on-resistance (Rdson), which refers to the source-to-drain resistance of the transistor when it is turned on. However, channel length of a MOS transistor, such as an LDMOS transistor, can affect the breakdown voltage and the on-resistance of the transistor. Thus, during transistor fabrication, it is important to precisely control the channel length of a MOS transistor, such as an LDMOS transistor.

In a conventional LDMOS transistor, a gate can be formed over a first well and an adjacent second well, a source region can be formed in the first well adjacent to a sidewall of the gate, and a drain region can be formed in the second well, where the drain region is spaced apart from an opposing sidewall of the gate. In the convention LDMOS transistor, a channel length can be defined by the distance between the source region and the second well.

Although the source region can be self-aligned to the gate, the second well is typically formed by a mask, which is not self-aligned. Consequently, mask alignment error can cause the channel length to vary from run to run during fabrication of the conventional LDMOS transistor. As a result of the run-to-run variation in channel length, the breakdown voltage and the on-resistance of the conventional LDMOS transistor can also vary from run to run, which is undesirable.

SUMMARY OF THE INVENTION

Method for fabricating a MOS transistor, such as an LDMOS transistor, with reduced channel length variation and related structure, substantially as shown in and/or described in connection with at least one of the figures, as set forth more completely in the claims.

BRIEF DESCRIPTION OF THE DRAWINGS

FIG. 1 shows a flowchart illustrating the steps taken to implement an embodiment of the present invention.

DETAILED DESCRIPTION OF THE INVENTION

Figure 2A:
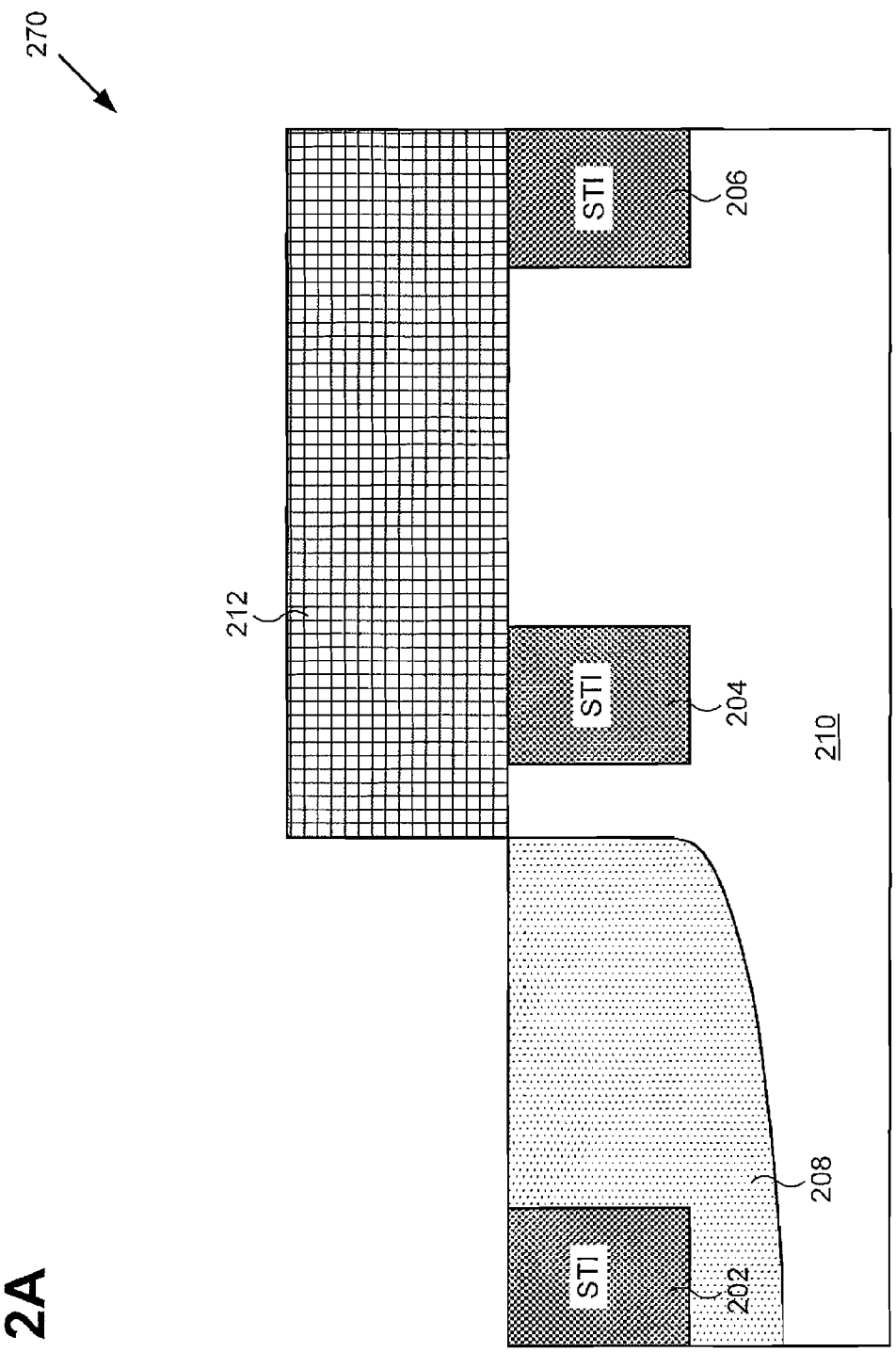
FIG. 2A illustrates a cross-sectional view, which includes a portion of a wafer processed according to an embodiment of the invention, corresponding to an initial step in the flowchart in FIG. 1.

The present invention is directed to a method for fabricating a MOS transistor with reduced channel length variation and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

The present invention achieves an innovative MOS transistor, such as an LDMOS transistor. As will be discussed in detail below, the present invention advantageously achieves a MOS transistor, such as an LDMOS transistor, having a self-aligned extension region, thereby significantly reducing channel length variation from run to run during transistor fabrication. The present invention can be applied to a P type (i.e. P channel) MOS (PMOS) transistor, such as a P type LDMOS transistor or an N type (i.e. N channel) MOS (NMOS) transistor, such as an N type LDMOS transistor.

In the present application, an N-channel MOS (NMOS) transistor, such as an N-channel LDMOS transistor, is utilized to illustrate an embodiment of the invention. However, as is manifest to one of ordinary skill in the art, other embodiments of the invention can be applied to a P-channel MOS (PMOS) transistor, such as a P-channel LDMOS transistor by, among other things, appropriately reversing the conductivity type of N type and P type regions in the N-channel LDMOS transistor.

FIG. 1 shows a flow chart illustrating a method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 170 through 180 indicated in flowchart 100 are sufficient to describe one embodiment of the present invention; however, other embodiments of the invention may utilize steps different from those shown in flowchart 100. It is noted that the processing steps shown in flowchart 100 are performed on a portion of wafer, which, prior to step 170, includes, among other things, a substrate, such as a silicon substrate.

Moreover, structures 270 through 280 in FIGS. 2A through 2F illustrate the result of performing steps 170 through 180 of flowchart 100, respectively. For example, structure 270 shows a semiconductor structure after processing step 170, structure 272 shows structure 270 after the processing of step 172, structure 274 shows structure 272 after the processing of step 174, and so forth.

Referring now to step 170 in FIG. 1 and structure 270 in FIG. 2A, at step 170 of flowchart 100, isolation regions 202, 204, and 206 and well 208 are formed in substrate 210. As shown in FIG. 2A, isolation regions 202, 204, and 206 are situated in substrate 210, which can be, for example, a P type substrate, such as a P type silicon substrate. Isolation regions 202, 204, and 206 can be, for example, shallow trench isolation (STI) regions and can comprise silicon oxide or other dielectric material. Also shown in FIG. 2A, well 208 is situated in substrate 210 and mask 212 is situated over isolation regions 204 and 206 and substrate 210. Well 208 can be, for example, a P type well (P well). In an embodiment in which a PMOS transistor, such as a P type LDMOS transistor, is being fabricated, well 208 can be an N type well (N well).

Mask 212 can comprise a masking material, such as photoresist, and can be formed by depositing a layer of masking material over substrate 210 and appropriately patterning the masking material so as to expose a portion of substrate 210 in which to form well 208. Well 208 can be formed by utilizing an implant process to appropriately dope the exposed portion of substrate 210 with, for example, a P type dopant, such as boron or boron difluoride (BF2). In an embodiment in which well 208 is an N well, well 208 can be formed by utilizing an implant process to appropriately dope the exposed portion of substrate 210 with an N type dopant, such as arsenic or phosphorus. After formation of well 208, mask 212 can be removed in a suitable etch process, such as a wet etch process. The result of step 170 of flowchart 100 is illustrated by structure 270 in FIG. 2A.

Figure 2B:
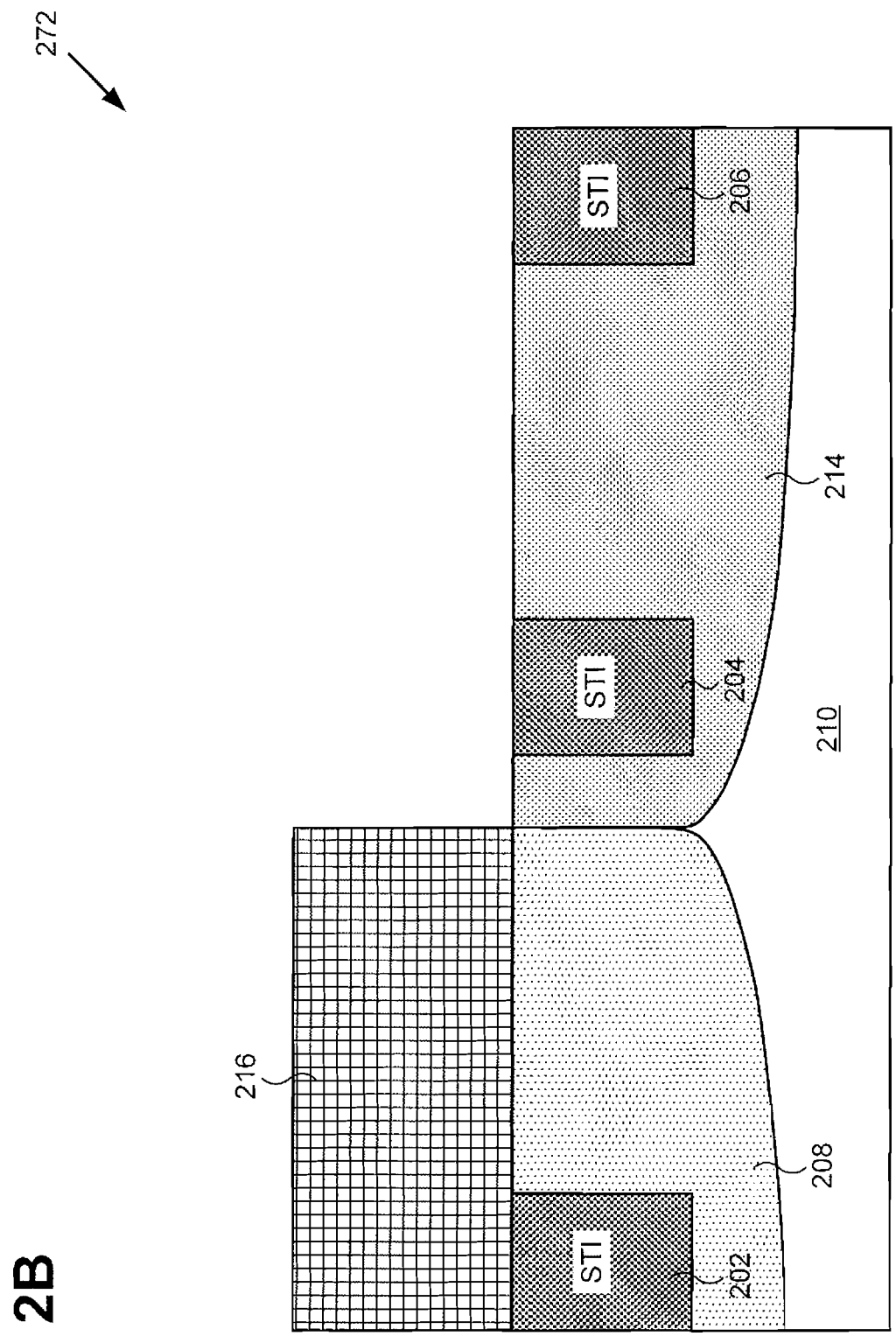
FIG. 2B illustrates a cross-sectional view, which includes a portion of a wafer processed according to an embodiment of the invention, corresponding to an intermediate step in the flowchart in FIG. 1.

Referring to step 172 in FIG. 1 and structure 272 in FIG. 2B, at step 172 of flowchart 100, well 214 is formed in substrate 210 adjacent to well 208, where well 214 and well 208 have an opposite conductivity type. As shown in FIG. 2B, well 214 is situated in substrate 210 adjacent to well 208, mask 216 is situated over well 208, and isolation regions 204 and 206 are situated in well 214. Well 214 can be, for example, an N well. In an embodiment in which a PMOS transistor, such as a P type LDMOS transistor, is being fabricated, well 214 can be a P well. Mask 216 can comprise a masking material, such as photoresist, and can be formed by depositing and appropriately patterning a layer of masking material so as to expose a portion of substrate 210 in which to form well 214 while protecting well 208 during the formation of well 214.

Well 214 can be formed, for example, by utilizing an implant process to appropriately dope the exposed portion of substrate 210 with an N type dopant, such as such as arsenic or phosphorus. In an embodiment in which well 214 is a P well, well 214 can be formed, for example, by utilizing an implant process to appropriately dope the exposed portion of substrate 210 with a P type dopant, such as such as boron or boron difluoride. After well 214 has been formed, mask 216 can be removed in a suitable etch process, such as a wet etch process. The result of step 172 of flowchart 100 is illustrated by structure 272 in FIG. 213.

Figure 2C:
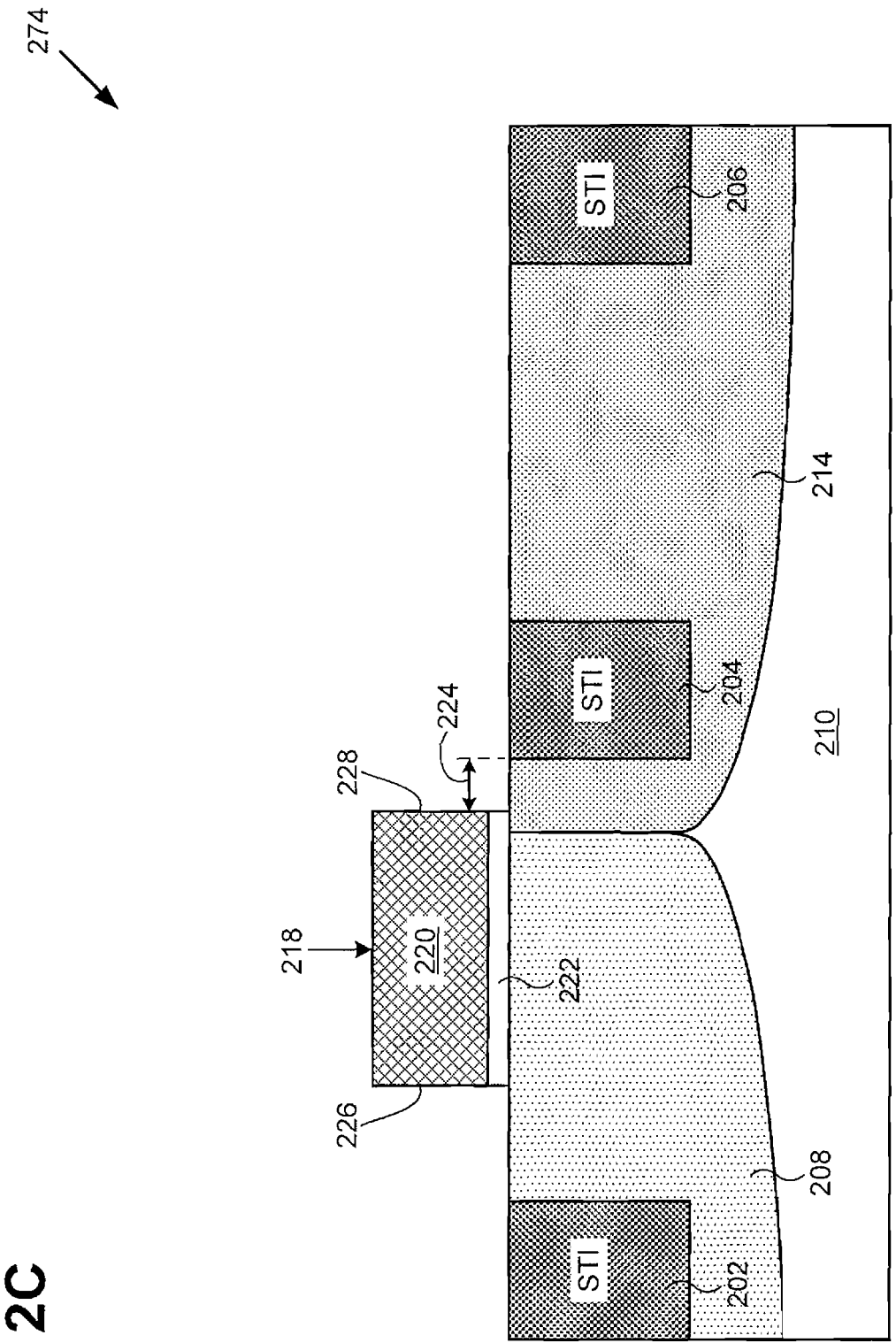
FIG. 2C illustrates a cross-sectional view, which includes a portion of a wafer processed according to an embodiment of the invention, corresponding to an intermediate step in the flowchart in FIG. 1.

Referring to step 174 in FIG. 1 and structure 274 in FIG. 2C, at step 174 of flowchart 100, gate stack 218 is formed over wells 208 and 214, where gate stack 218 includes gate 220 and gate insulator 222, and where gate 220 is laterally separated from isolation region 204 by distance 224. As shown in FIG. 2C, gate stack 218 includes gate insulator 222, which is situated over well 208 and well 214, and gate 220, which is situated over gate insulator 222. Gate insulator 222 can comprise, for example, silicon oxide, silicon oxynitride, or a high dielectric constant (high-k) dielectric material. Gate 220 has sidewalls 226 and 228 and can comprise a conductive material, such as polycrystalline silicon (polysilicon) or a metal or metal stack.

Gate stack 218 can be formed, for example, by utilizing a chemical vapor deposition (CVD) process or other depositing process to deposit a layer of dielectric material, such as silicon oxide, over wells 208 and 214. A layer of conductive material, such as polysilicon, can then be deposited over the layer of dielectric material by utilizing a CVD process, a low pressure chemical vapor deposition (LPCVD) process, or other suitable deposition process. After the layer of conductive material has been deposition, the layer of conductive material and the underlying layer of dielectric material can be etched in an etch process, such as, for example, a reactive ion etch (RIE) process, so as to form gate 220 and gate insulator 222. Gate stack 218 and, consequently, gate 220 can be aligned to isolation region 204 so as to define distance 224 (i.e. the lateral spacing between sidewall 228 of gate 220 and isolation region 204). Distance 224 can range, for example, from approximately 10.0 nanometers (nm) to approximately 0.5 microns in an embodiment of the invention. The result of step 174 of flowchart 100 is illustrated by structure 274 in FIG. 2C.

Figure 2D:
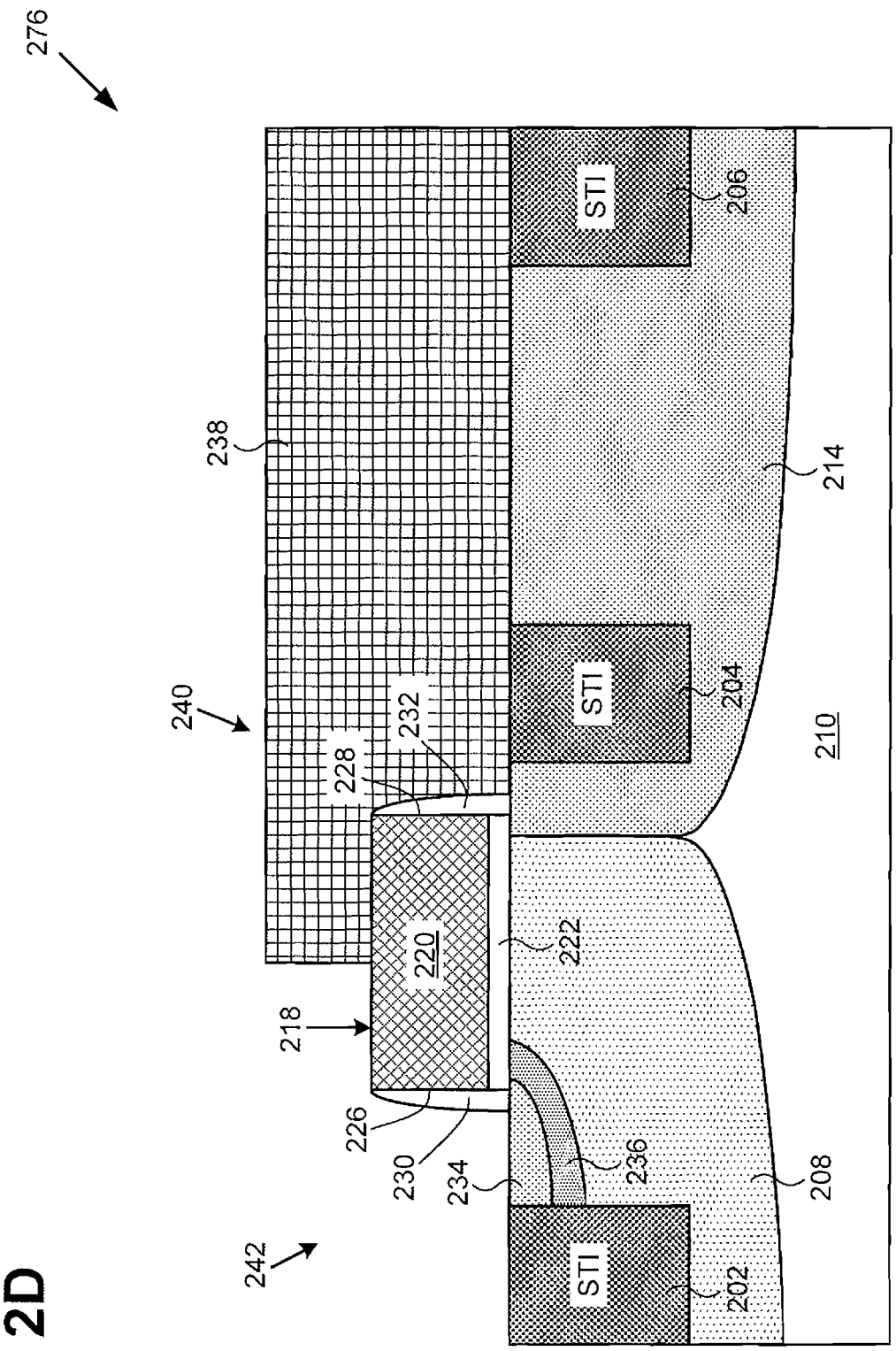
FIG. 2D illustrates a cross-sectional view, which includes a portion of a wafer processed according to an embodiment of the invention, corresponding to an intermediate step in the flowchart in FIG. 1.

Referring to step 176 in FIG. 1 and structure 276 in FIG. 2D, at step 176 of flowchart 100, inner spacers 230 and 232 are formed adjacent to respective sidewalls 226 and 228 of gate 220, lightly doped region 234 is formed in well 208 adjacent to sidewall 226 of gate 220, and halo implanted region 236 is formed adjacent to lightly doped region 234. As shown in FIG. 2D, inner spacers 230 and 232 are situated adjacent to respective sidewalls 226 and 228 of gate 220 and can comprise, for example, silicon oxide, silicon nitride, or other dielectric material. Inner spacers 230 and 232 can be formed, for example, by conformally deposited a layer of dielectric material, such silicon oxide, over gate stack 218 and etching the layer of dielectric material in a spacer etch process.

Also shown in FIG. 2D, lightly doped region 234 is situated in well 208 and can be a lightly doped N type region. In one embodiment, lightly doped region 234 can be a lightly doped P type region. Lightly doped region 234 can be formed, for example, by forming mask 238 so as to protect drain-side 240 of gate 220 while exposing well 208 on source-side 242 of gate 220. Mask 238 can be formed by depositing and appropriately patterning a layer of masking material, such as photoresist. An implant process can then be utilized to implant an N type dopant, such as arsenic or phosphorus, into the exposed portion of well 208 adjacent to inner spacer 230, thereby forming lightly doped region 234, which can extend under inner spacer 230 and gate 220. Since the implant process can be self-aligned to gate 220, lightly doped region 234 is also self-aligned to gate 220. Thus, in an embodiment of the present invention, lightly doped region 234 is a self-aligned lightly doped region.

After lightly doped region 234 has been formed, halo implanted region 236 can be formed by utilizing a halo implant to implant, for example, a P type dopant, such as boron or boron difluoride, into well 208 adjacent to lightly doped region 234. Halo implanted region 236 has an opposite conductivity type as lightly doped region 234 and can extend under gate 220. Thus, in an embodiment in which lightly doped region 234 is a P type region, halo implanted region 236 can be an N type region. In one embodiment, halo implanted region 236 is not utilized. The result of step 176 of flowchart 100 is illustrated by structure 276 in FIG. 2D.

Figure 2E:
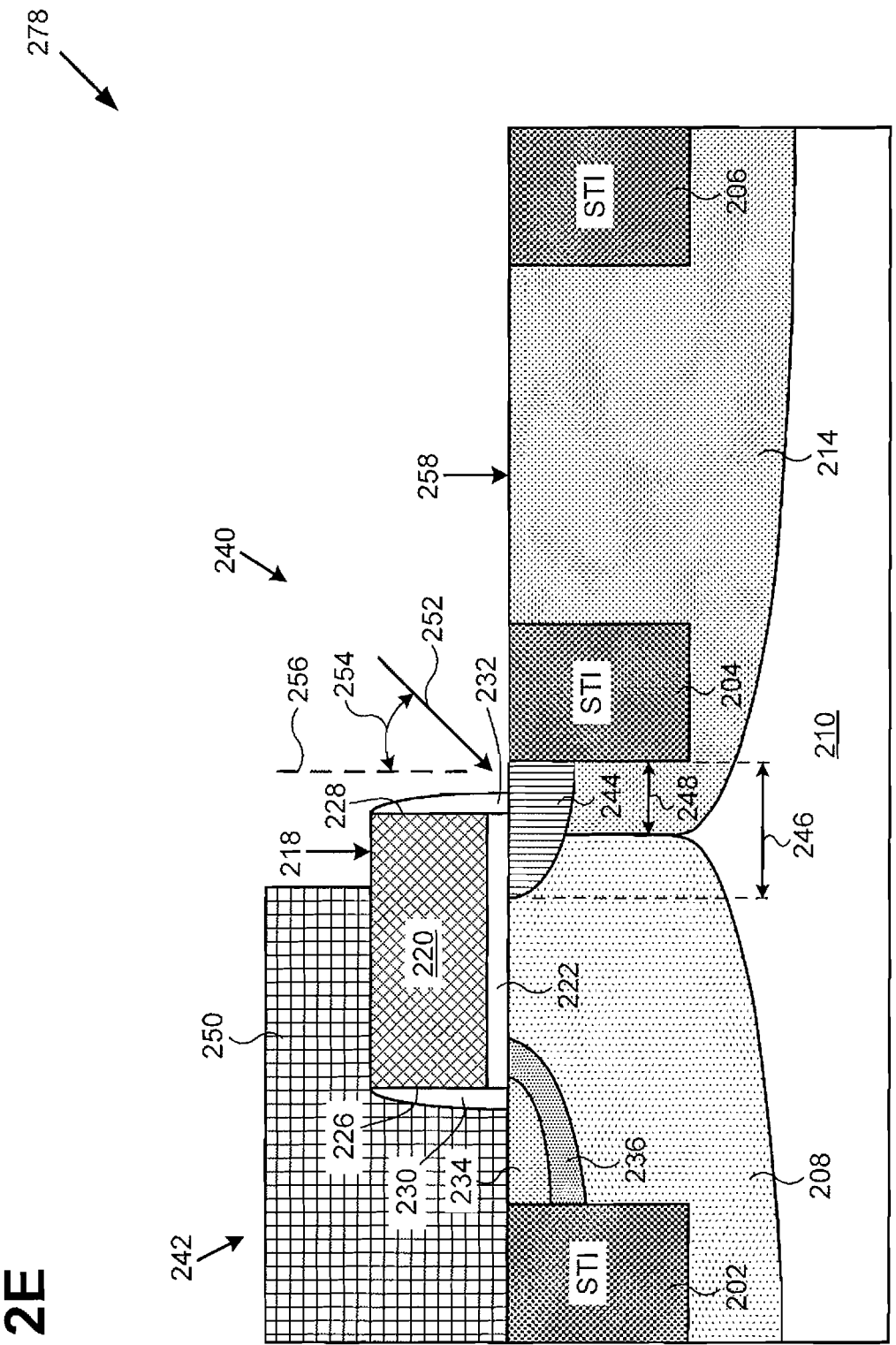
FIG. 2E illustrates a cross-sectional view, which includes a portion of a wafer processed according to an embodiment of the invention, corresponding to an intermediate step in the flowchart in FIG. 1.

Referring to step 178 in FIG. 1 and structure 278 in FIG. 2E, at step 178 of flowchart 100, extension region 244 is formed so as to extend under gate 220 from well 214 into well 208, where extension region 244 is a self-aligned extension region. As shown in FIG. 2E, extension region 244 can be, for example, an N type region and can extend from well 204 and isolation region 204 into well 208 underlying gate 220. Extension region 244 can have the same conductivity type as well 214. Thus, in an embodiment in which well 214 is a P well, extension region 244 can be a P type region. Also shown in FIG. 2E, extension region 244 extends distance 246 from isolation region 204 and well 214 extends distance 248 from isolation region 204. In an embodiment of the invention, distance 246 is greater than distance 248 so that extension region 204 can determine a channel length of a subsequently formed MOS transistor, such as an LDMOS transistor. Thus, extension region 244 extends a greater distance from isolation region 204 than well 214. Consequently, extension region 244 extends a greater distance under gate 220 than well 214.

Extension region 244 is self-aligned to gate 220 and can be formed by forming mask 250 so as to protect source-side 242 of gate 220 while exposing well 214 on drain-side 240 of gate 220. Mask 250 can be formed by depositing and appropriately patterning a layer of masking material, such as photoresist. After mask 250 has been formed, a halo implant (indicated by arrow 252) can be performed to implant dopant under sidewall 228 of gate 220 and into wells 208 and 214 so as to form extension region 244. The halo implant can be performed at tilt angle 254, which is formed with respect to the axis indicated by dashed line 256, which extends substantially perpendicular to top surface 258 of substrate 210. Tilt angle 254 is also formed with respect to sidewall 228 of gate 220. Tilt angle 254 can be in a range of, for example, from approximately 20.0 degrees to approximately 45.0 degrees. Extension region 244 can be controlled by precisely controlling the halo implant utilized to form extension region 244. Since the halo implant is self-aligned to gate 220, extension region 244 is also self-aligned to gate 220. Thus, extension region 244 is a self-aligned extension region. The result of step 178 of flowchart 100 is illustrated by structure 278 in FIG. 2E.

Figure 2F:
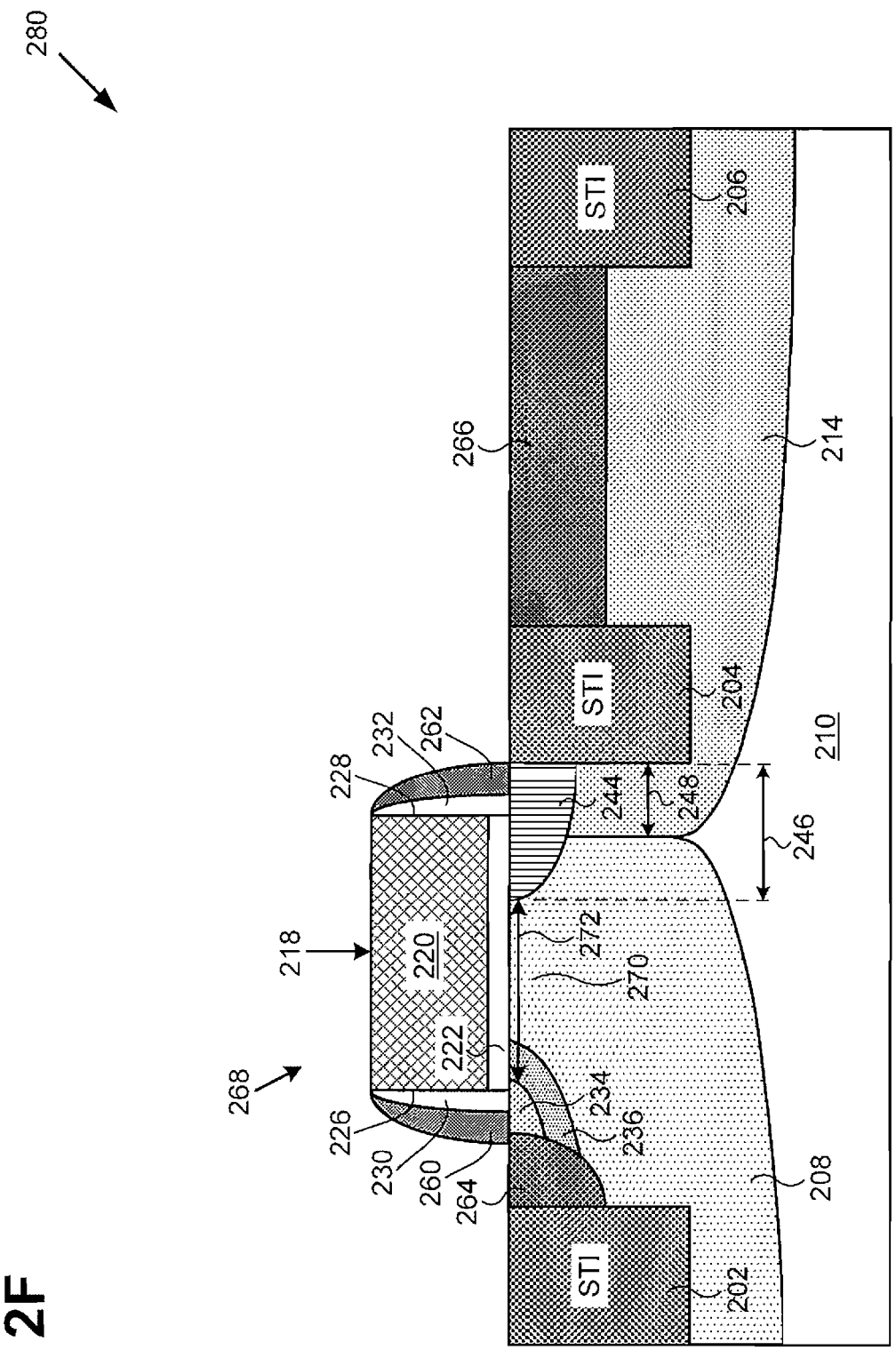
FIG. 2F illustrates a cross-sectional view, which includes a portion of a wafer processed according to an embodiment of the invention, corresponding to final step in the flowchart in FIG. 1.

Referring to step 180 in FIG. 1 and structure 280 in FIG. 2F, at step 180 of flowchart 100, outer spacers 260 and 262 are formed adjacent to respective inner spacers 230 and 232, heavily doped source region 264 is formed in well 208 adjacent to gate 220, and heavily doped drain region 266 is formed in well 214, where drain region 266 is spaced apart from sidewall 228 of gate 220 by isolation region 204. As shown in FIG. 2F, outer spacers 260 and 262 can comprise, for example, silicon oxide, silicon nitride, or other dielectric material, and are situated adjacent to respective inner spacers 230 and 232. Outer spacers 260 and 262 can be formed, for example, by conformally deposited a layer of dielectric material, such silicon oxide or silicon nitride, over gate stack 218 and inner spacers 230 and 232 and appropriately etching the layer of dielectric material in a spacer etch process.

Also shown in FIG. 2F, source region 264 is situated in well 208 adjacent to sidewall 226 of gate 220 and drain region 266 is situated in well 214 between isolation regions 204 and 206. Drain region 266 is also laterally separated (i.e. spaced apart) from gate 220 by isolation region 204. Source region 264 and drain region 266 can each be heavily doped with, for example, an N type dopant, such as arsenic or phosphorus. In an embodiment in which a PMOS transistor, such as a P type LDMOS transistor, is being fabricated, source region 264 and drain region 266 can each be heavily doped with a P type dopant, such as boron or boron difluoride. Source region 264 and drain region 266 can be formed by utilizing a source/drain implant process to heavily dope exposed portions of respective wells 208 and 214 with an appropriate dopant. After source region 264 and drain region 266 have been formed, silicide segments (not shown in FIG. 2F) can be formed in source region 264, drain region 266, and gate 220 in a manner known in the art.

Thus, as shown in FIG. 2F, an embodiment of the invention's MOS transistor 268, such as an LDMOS transistor, is formed to include gate stack 218, which includes gate 220 and gate insulator 222, inner spacers 230 and 232, lightly doped region 234, halo implanted region 236, extension region 244, outer spacers 260 and 262, source region 264, and drain region 266. MOS transistor 268 also includes channel 270, which is formed under gate 220 in well 208. Channel 270 has channel length 272, which corresponds to the distance between lightly doped region 234, which underlies sidewall 226 of gate 220, and extension region 244, which underlies opposing sidewall 228 of gate 220.

As discussed above, lightly doped region 234 and extension region 244 are each self-aligned to gate 220. Thus, in an embodiment of the present invention, channel length 272 is defined by the distance between two self-aligned regions (i.e. lightly doped region 234 and extension region 244). Thus, channel length 272 is defined by a self-aligned lightly doped region (i.e. lightly doped region 234) and a self-aligned extension region (i.e. extension region 244). By defining a channel length between two self-aligned regions (i.e. a self-aligned lightly doped region and a self-aligned extension region), an embodiment of the invention can reduce run-to-run variation in channel length during transistor fabrication. By reducing run-to-run channel length variation during transistor fabrication, an embodiment of the invention can also advantageously reduce run-to-run variation in breakdown voltage and in on-resistance of a MOS transistor, such as an LDMOS transistor.

In contrast, in a conventional LDMOS transistor the channel length is defined by the distance between a source region, which is self-aligned to a gate, and a well, such as well 214, which is not self-aligned. Thus, in the conventional LDMOS transistor, channel length is not defined between two self-aligned regions. As a result, channel length can vary significantly from run-to-run during fabrication of a conventional LDMOS transistor.

Thus, by providing a self-aligned extension region to define channel length, an embodiment of the invention's MOS transistor, such as an LDMOS transistor, can advantageously provide significantly reduced channel length variation compared to a conventional LDMOS transistor. By significantly reducing channel length variation, an embodiment of the invention can provide a MOS transistor, such as an LDMOS transistor, having significantly reduced run-to-run variation in breakdown voltage and in on-resistance compared to a conventional LDMOS transistor.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A method for fabricating a MOS transistor, said method comprising:
   forming a self-aligned lightly doped region in a first well underlying a first sidewall of a gate;
   forming a self-aligned extension region under a second sidewall of said gate, said self-aligned extension region extending into said first well from a second well extending under said gate, said self-aligned extension region and said second well having a same conductivity type;
   forming a drain region spaced apart from said second sidewall of said gate.

2. The method of claim 1, wherein said self-aligned lightly doped region and said self-aligned extension region define a channel length of said MOS transistor.

3. The method of claim 1 further comprising forming a source region in said self-aligned lightly doped region and said first well.

4. The method of claim 1, wherein said forming said self-aligned extension region comprises utilizing a halo implant self-aligned to said gate.

5. The method of claim 1, wherein said drain region is separated from said second sidewall of said gate by an isolation region.

6. The method of claim 5, wherein said self-aligned extension region extends under said gate a greater distance from said isolation region than said second well.

7. The method of claim 1, wherein said second well and said self-aligned extension region have an opposite conductivity type than said first well.

8. The method of claim 1 further comprising forming a halo implanted region adjacent to said self-aligned lightly doped region prior to said forming said self-aligned extension region.

9. The method of claim 1 further comprising forming an inner spacer adjacent said first and second sidewalls of said gate prior to said forming said self-aligned extension region.

10. The method of claim 1, wherein said MOS transistor is an LDMOS transistor.

11. A method for fabricating a MOS transistor, said method comprising:
    forming a lightly doped region in a first well underlying a first sidewall of a gate;
    forming an extension region under a second sidewall of said gate, said extension region extending into said first well from a second well extending under said gate, said extension region and said second well having a same conductivity type;
    forming a drain region spaced apart from said second sidewall of said gate.

12. The method of claim 11 wherein said lightly doped region and said extension region define a channel length of said MOS transistor.

13. The method of claim 11 further comprising forming a source region in said lightly doped region and said first well.

14. The method of claim 11 wherein said forming said extension region comprises utilizing a halo implant self-aligned to said gate.

15. The method of claim 11 wherein said drain region is separated from said second sidewall of said gate by an isolation region.

16. The method of claim 15 wherein said extension region extends under said gate a greater distance from said isolation region than said second well.

17. The method of claim 11 wherein said second well and said extension region have an opposite conductivity type relative to said first well.

18. The method of claim 11 further comprising forming a halo implanted region adjacent to said lightly doped region prior to said forming said extension region.

19. The method of claim 11 further comprising forming an inner spacer adjacent said first and second sidewalk of said gate prior to said forming said extension region.

20. The method of claim 11 wherein said MOS transistor is an LDMOS transistor.

* * * * *

UNITED STATES PATENT AND TRADEMARK OFFICE
CERTIFICATE OF CORRECTION

PATENT NO. : 8,748,277 B2  
APPLICATION NO. : 13/613520  
DATED : June 10, 2014  
INVENTOR(S) : Xiangdong Chen et al.

Page 1 of 1

It is certified that error appears in the above-identified patent and that said Letters Patent is hereby corrected as shown below:

In the Claims:

Column 7, line 20, insert --,-- after "The method of claim 1"

Column 7, line 35, insert --,-- after "The method of claim 1"

Column 7, line 39, insert --,-- after "The method of claim 1"

Column 8, line 14, insert --,-- after "The method of claim 11"

Column 8, line 17, insert --,-- after "The method of claim 11"

Column 8, line 20, insert --,-- after "The method of claim 11"

Column 8, line 23, insert --,-- after "The method of claim 11"

Column 8, line 26, insert --,-- after "The method of claim 15"

Column 8, line 29, insert --,-- after "The method of claim 11"

Column 8, line 32, insert --,-- after "The method of claim 11"

Column 8, line 36, insert --,-- after "The method of claim 11"

Column 8, line 37, change "sidewalk" to --sidewalls-- after "inner spacer adjacent said first and second"

Column 8, line 39, insert --,-- after "The method of claim 11"

Signed and Sealed this  
Twenty-fourth Day of February, 2015

Michelle K. Lee  
*Deputy Director of the United States Patent and Trademark Office*